US006528800B1

(12) United States Patent
Dzwierzynski et al.

(10) Patent No.: US 6,528,800 B1

(45) Date of Patent: Mar. 4, 2003

(54) PARTICULATE CURING SYSTEM

(75) Inventors: Jerome A. Dzwierzynski, LaGrange Park, IL (US); Chad Rhodes, Lake Villa, IL (US); Daniel G. Swanson, Salem, WI (US)

(73) Assignee: Steris, Inc., Temecula, CA (US)

( * ) Notice: Subject to any disclaimer, the term of this patent is extended or adjusted under 35 U.S.C. 154(b) by 0 days.

(21) Appl. No.: 09/517,772

(22) Filed: Mar. 3, 2000

Related U.S. Application Data

(60) Provisional application No. 60/122,678, filed on Mar. 3, 1999.

(51) Int. Cl.[7] .............................................. H01J 37/20

(52) U.S. Cl. .................. 250/432 R; 250/433; 250/435; 250/428; 406/79; 406/82; 406/180

(58) Field of Search ............................ 250/435, 432 R, 250/433, 428; 406/79, 82, 180

(56) References Cited

U.S. PATENT DOCUMENTS 2,602,751 A 7/1952 Robinson
3,452,195 A 6/1969 Brunner
3,564,241 A 2/1971 Ludwig
3,676,675 A 7/1972 Ransohoff et al.
4,006,812 A * 2/1977 Everett et al. ........... 198/347.1
4,561,358 A 12/1985 Burgess
4,572,086 A * 2/1986 Ladt et al. .................. 110/347
4,852,138 A 7/1989 Bergeret et al.
5,396,074 A 3/1995 Peck et al.
5,801,387 A * 9/1998 Nablo et al. ................ 250/435
5,994,706 A 11/1999 Allen et al.

OTHER PUBLICATIONS

J. Williams, "Weighing the Choices in Radiation Sterilization: Electron–Beam and Gamma," *Medical Device & Diagnostic Industry*, Mar. 1995.

Corporate Profile Advertisement, "Electron Beam Sterilization Comes to the Midwest," *Canon Communications, Inc.*, 1995.

* cited by examiner

*Primary Examiner*—Jack Berman
(74) *Attorney, Agent, or Firm*—Fay, Sharpe, Fagan, Minnich & McKee, LLP

(57) ABSTRACT

A conveying system (22) transports loose particulate material past a radiation source (200). A feed system (20) discharges particulate material onto the conveying system (22). A pneumatic system with an inlet manifold (14) and tubes (16) provides air through which the particulate material is fluidly transported to the feed system (20). A receiving hopper (24) receives the particulate matter from the conveying system (22). A dump hopper (10) dumps the particulate material into the pneumatic system. A discharge manifold (18) separates the particulate material from air. A metering gate (70) is located at a base of a hopper (69), which controls the layer of particulate material deposited onto said conveyor. A second inlet manifold (26) and tubes (28) adjacent the receiving hopper entrains the particulate material in air. A receiving station (32) receives the particulate material from a second discharge manifold (30).

26 Claims, 11 Drawing Sheets

PARTICULATE CURING SYSTEM

This application claims priority from Provisional Application Ser. No. 60/122,678, filed on Mar. 3, 1999.

BACKGROUND OF THE INVENTION

The present invention relates to the art of material treatment. It finds particular application with a vacuum pneumatic conveying system to deliver plastic pellet material to a belt conveyor. The pellets are carried on the belt conveyor past an electron beam source for irradiation treatment. It is to be appreciated that the present invention is also applicable to the treatment of other materials, such as grains, seeds, other polymers, and the like.

Currently, plastic pellets are loaded in trays to be conveyed through an irradiation unit. Typically, the trays are raked and sent through the unit again for retreatment until an appropriate total radiation dose is reached. This prior system has drawbacks including the large amounts of manual labor, consistent dose assurance, and problems attributable to heating of the polymer material of the pellets.

The present invention contemplates a new and improved apparatus and method which overcome the above referenced problems and others.

SUMMARY OF THE INVENTION

In accordance with one aspect of the present invention, an apparatus is provided for irradiating particulate material. The particulate material is suspended in a moving fluid and conveyed to a source of radiation. The pelletized material is passed at a controlled rate through the radiation. The pelletized material is fluidized and conveyed from the radiation, the fluidizing concurrently cooling the pelletized material.

In accordance with a more limited aspect of the present invention, the pelletized material is deposited in a layer of uniform thickness on a belt conveyor prior to passing through the radiation and is removed from the belt conveyor and refluidized after irradiation.

In accordance with another more limited aspect of the present invention, the pellets are a polymeric material which pass through the radiation at a known rate to achieve a preselected polymerization reaction.

In accordance with another aspect of the present invention, the fluidized particulate material is passed through the radiation while suspended in the fluid.

In accordance with yet another aspect of the present invention, fluids themselves, such as liquid sewage, waste water, stack gasses, and the like, are treated by the radiation beam.

A principle advantage of the present invention is the provision for transporting loose particulate material passed an irradiation source at a controlled rate.

Another advantage of the present invention is that plastic pellets are treated with an accurately controlled dose of radiation.

Still another advantage of the present invention is manual labor and human process variations are minimized.

Yet another advantage of the present invention is that particulate material is entrained, irradiated and recollected into the same container, all without human intervention.

Still further advantages of the present invention will become apparent to those of ordinary skill in the art upon reading and understanding of the following detailed description of the preferred embodiment.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENT

A containment room is defined by a series of walls which are impermeable to radiation. An access entrance is defined by a tortuous path of radiation impermeable walls such that scattered irradiation does not escape the containment room. Exterior to the containment room, particulate material, such as polymeric pellets, are emptied from large shipping containers onto a conveying system for conveying the particulate material into the containment room. More specifically to the preferred embodiment, the plastic pellets are fluidized in air and pneumatically conveyed into the containment room. In the containment room, they are separated from the air flow and passed at a metered room through the radiation. More particularly to the preferred embodiment, the particles are formed into a layer of selected thickness and passed at a known rate through an electron beam of selected energy. After being irradiated, the particulate material is recollected and conveyed out of the containment room and repackaged in the original shipping containers. In the preferred embodiment, the plastic pellets are again entrained in air and conveyed pneumatically from the containment room.

Figure 1:
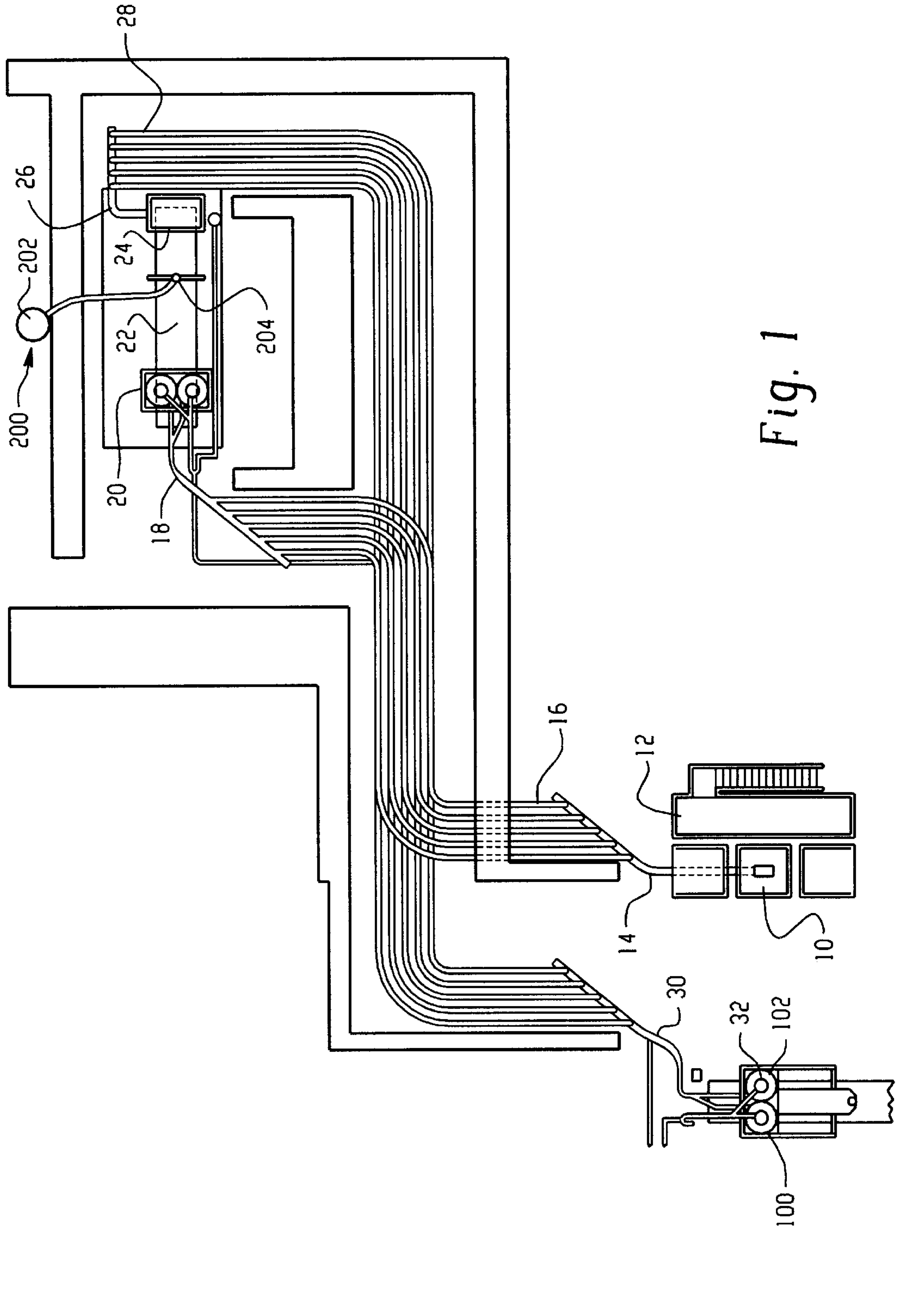
FIG. 1 is a top elevational view of the plastic pellet vacuum system in accordance with a preferred embodiment of the present invention.
Figure 6:
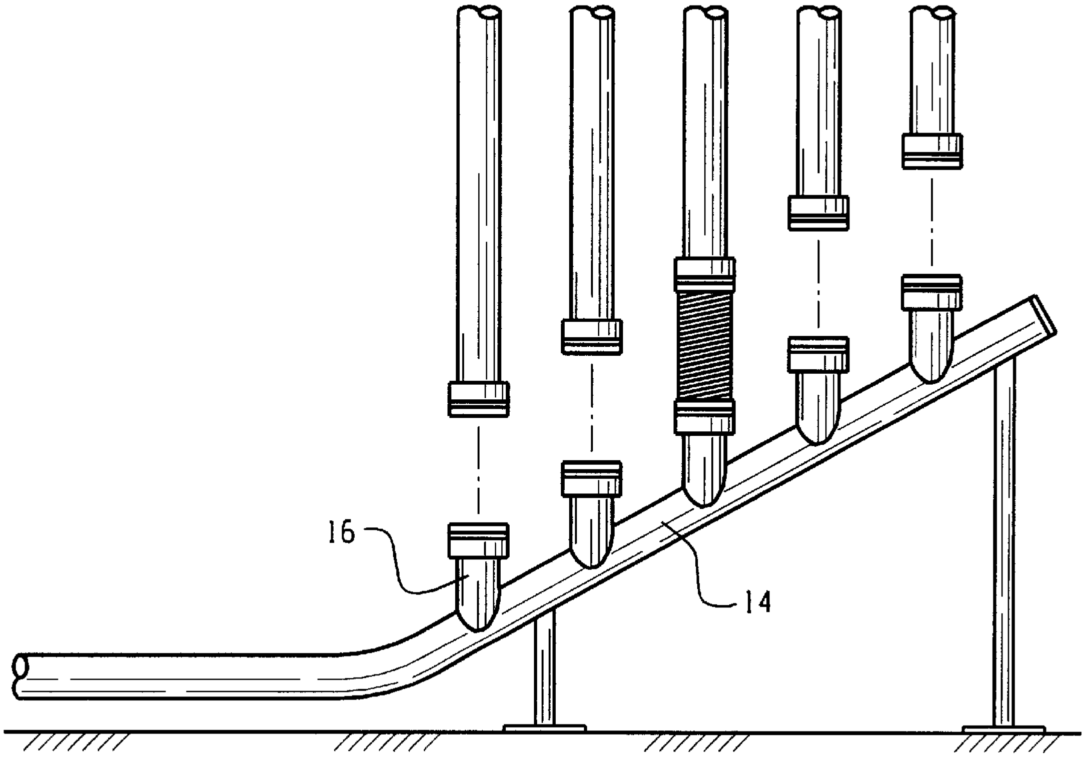
FIG. 6 is a top elevational view of the pipes and diverter valves of the system of FIG. 1.

With reference to FIG. 1, a dump hopper 10 is adjacent a dumping work platform 12. The bottom of the hopper is connected to a pneumatic tubing inlet manifold 14 (shown in FIG. 6) which in turn feeds into a series of pneumatic tubes or pipes 16. Five pipes 16 are shown in FIG. 1, but a different number of pipes may be used. Preferably, the tubes or pipes 16 are fabricated from stainless steel. The pipes 16 form a path through which air is blown to entrain and convey particulate material, such as plastic pellets, through the path. Air is blown into the system from outside the system. The air is fed into the inlet manifold 14 and is controlled by a diverter valve (not shown). The diverter valve sets the flow rate of air. As additional pellets are needed, the flow rate is increased. If too many pellets are being fed through, the flow rate is decreased.

The pneumatic tubing 16 feeds into a discharge manifold 18. The manifold 18 in turn feeds the pellets into the belt feeding system 20, which is discussed in more detail below. From the belt feeding system 20, loose pellets are discharged from a stream of air and are formed into a layer on a belt conveyor 22. The pellets are then transported on the belt conveyor 22 passed a radiation source 200 and are irradiated. Preferably, the radiation source is a 5 MeV electron beam. A magnetic accelerator 202 accelerates electrons to form an electron beam. A deflection circuit 204 sweeps the beam back and forth across the belt 22. The beam deflector is located above the conveyor belt 22 such that the beam is directed vertically downward.

Alternately, depending upon irradiation time, the pellets remain fluidized into the air flow, or pushed by the air, moved by vibration, and the like, through the electron beam.

The irradiated pellets from the conveyor are received in a receiving hopper 24 which is located at the other end of the conveyor belt and below the belt. Below the hopper 24, the pellets are entrained in flowing air and distributed by a second inlet manifold 26 into another series of pneumatic pipes 28.

The air also serves to cool the pellets which were heated by the electron beam. Heating of the pellets, which are preferably a polymer, can affect the properties of the pellets.

The pellets are then carried through the pipes 28 to a second discharge manifold 30 which in turns separates the pellets from the air into a receiving station 32 for packaging or bagging.

Figure 2A:
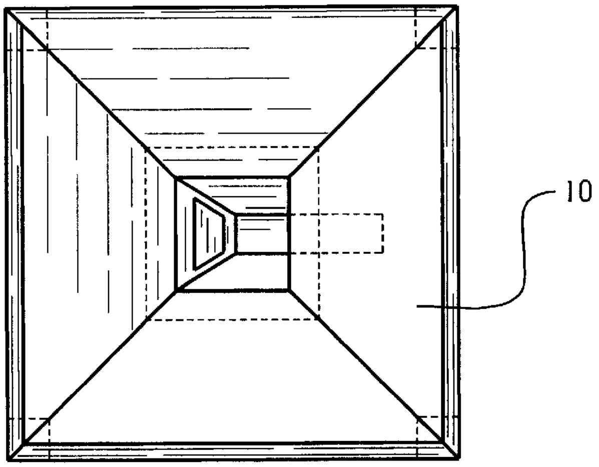
FIGS. 2A, 2B, and 2C are top and two-side elevational views of a dump hopper of the system of FIG. 1.
Figure 2B:
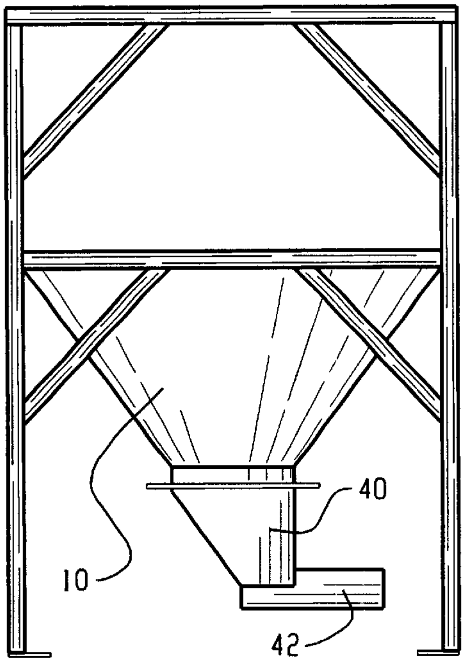
Figure 2C:
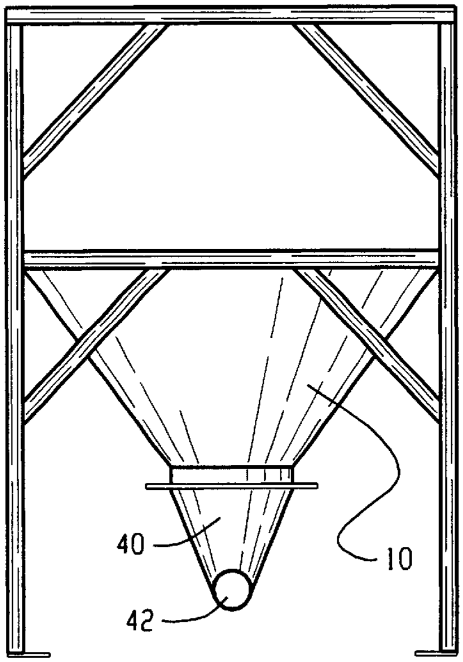
Figure 3:
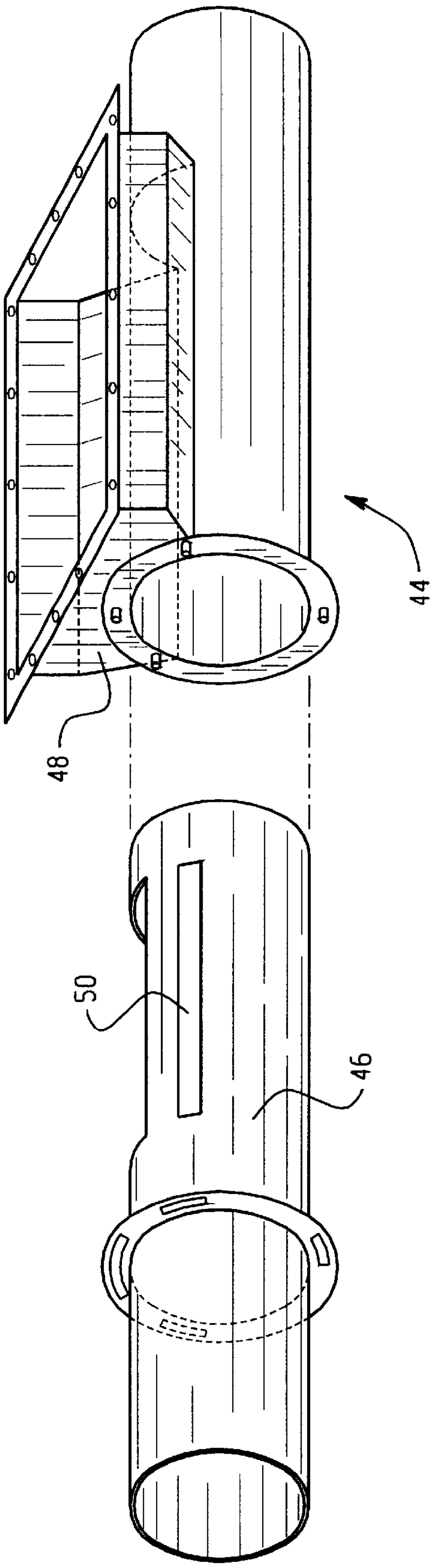
FIG. 3 is an expanded side perspective view of the vacuum take-off box of the dump hopper of FIG. 2.
Figure 4A:
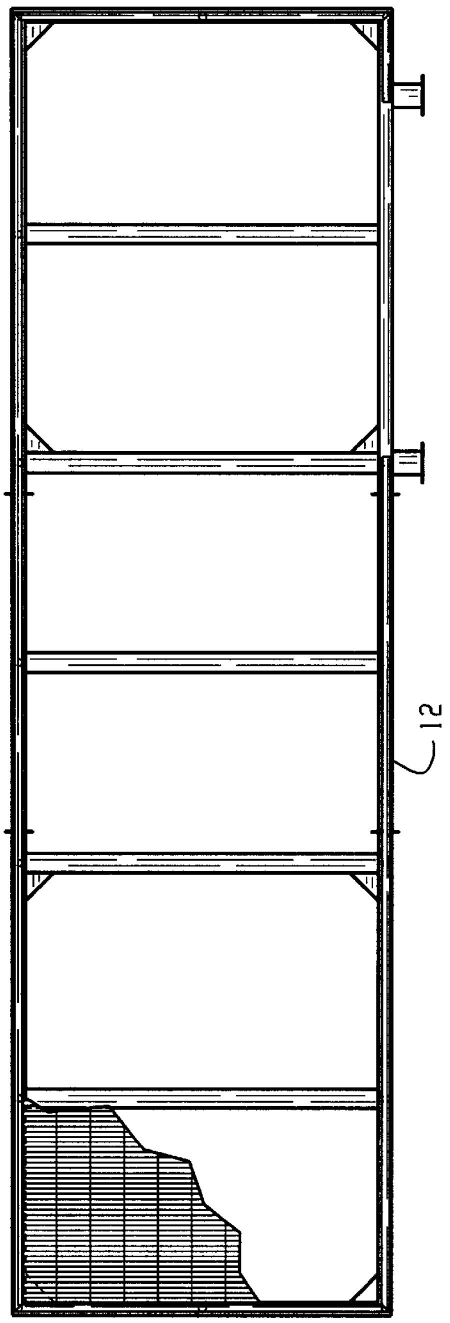
FIGS. 4A and 4B are top and side elevational views of the dumping work platform of the system of FIG. 1.
Figure 4B:
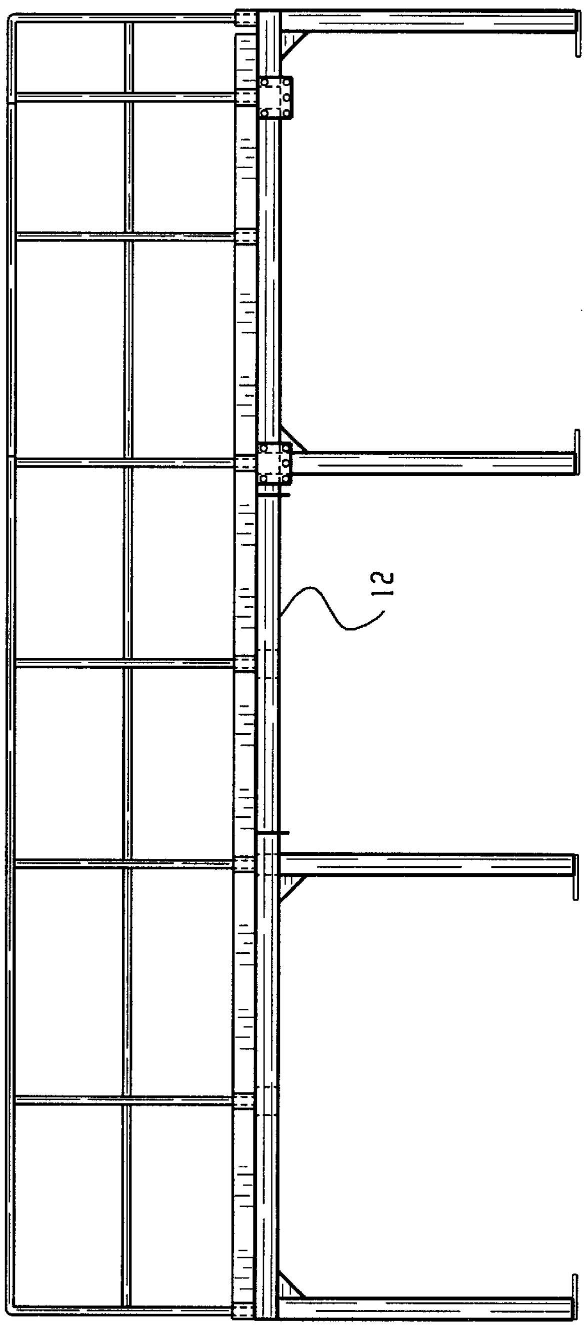
Figure 5A:
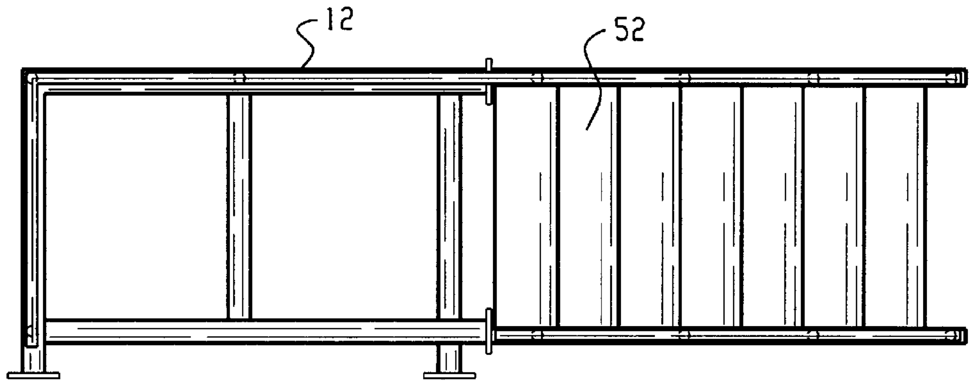
FIGS. 5A and 5B are top and side elevational views of the ladder and work platform of FIG. 4.
Figure 5B:
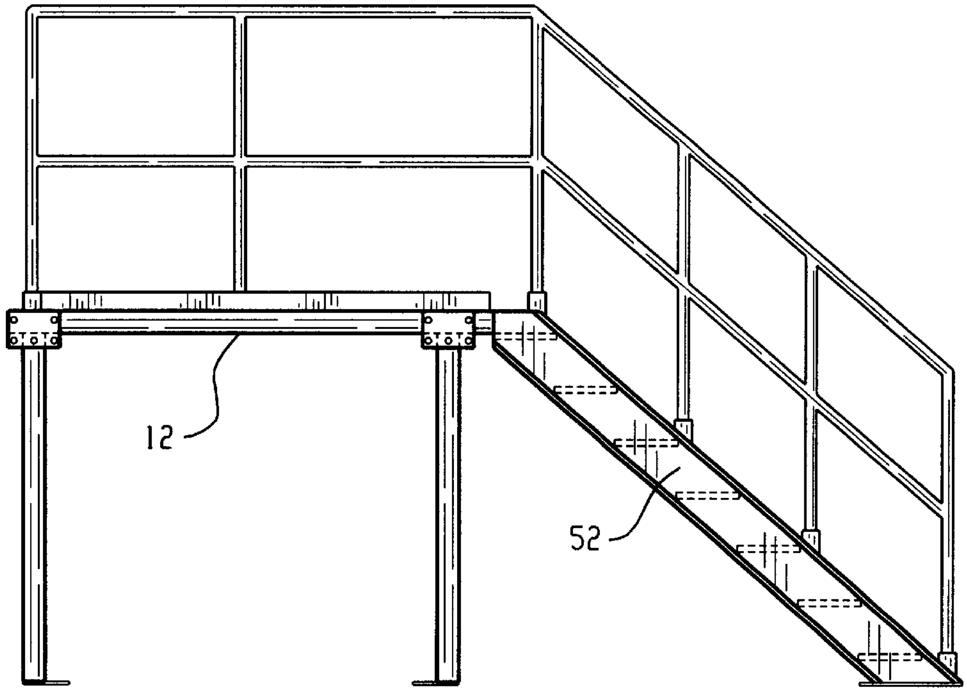

Referring now to FIGS. 2A, 2B and 2C, a funnel 40 is located at the bottom of the dump hopper 10 to feed pellets into a pneumatic interface 42. Preferably, the interface 42 comprises a vacuum take off box 44, as shown in detail in FIG. 3. The pipe interface 42 feeds the manifold 14.

The vacuum take-off box 44 comprises a tube 46 and a box 48. Preferably, the tube 46 has one or more slots 50 which control the volume or rate at which the pellets enter the tube 46.

Referring now to FIGS. 4A, 4B, 5A and 5B, the dumping work platform 12 consists of steel tubing, platforms and railings. Stairs 52 provide attendant access to the platform. Boxes or polyethylene bags of pellets can be lifted with a hoist over the hopper 10 for dumping. The stairs provide human access, as necessary, to guide the dumping or remedy any malfunctions.

As the pellets are deposited into the dump hopper 10, they flow to the take-off box 44. The inlet manifold 14 feeds the pellets into one or more pneumatic pipes or tubes 16. The entrained pellets travel with the air flow to the belt feeding system 20. The air flow is provided by a source (not shown). A diverter valve (not shown) is used to control the air flow rate.

Figure 7:
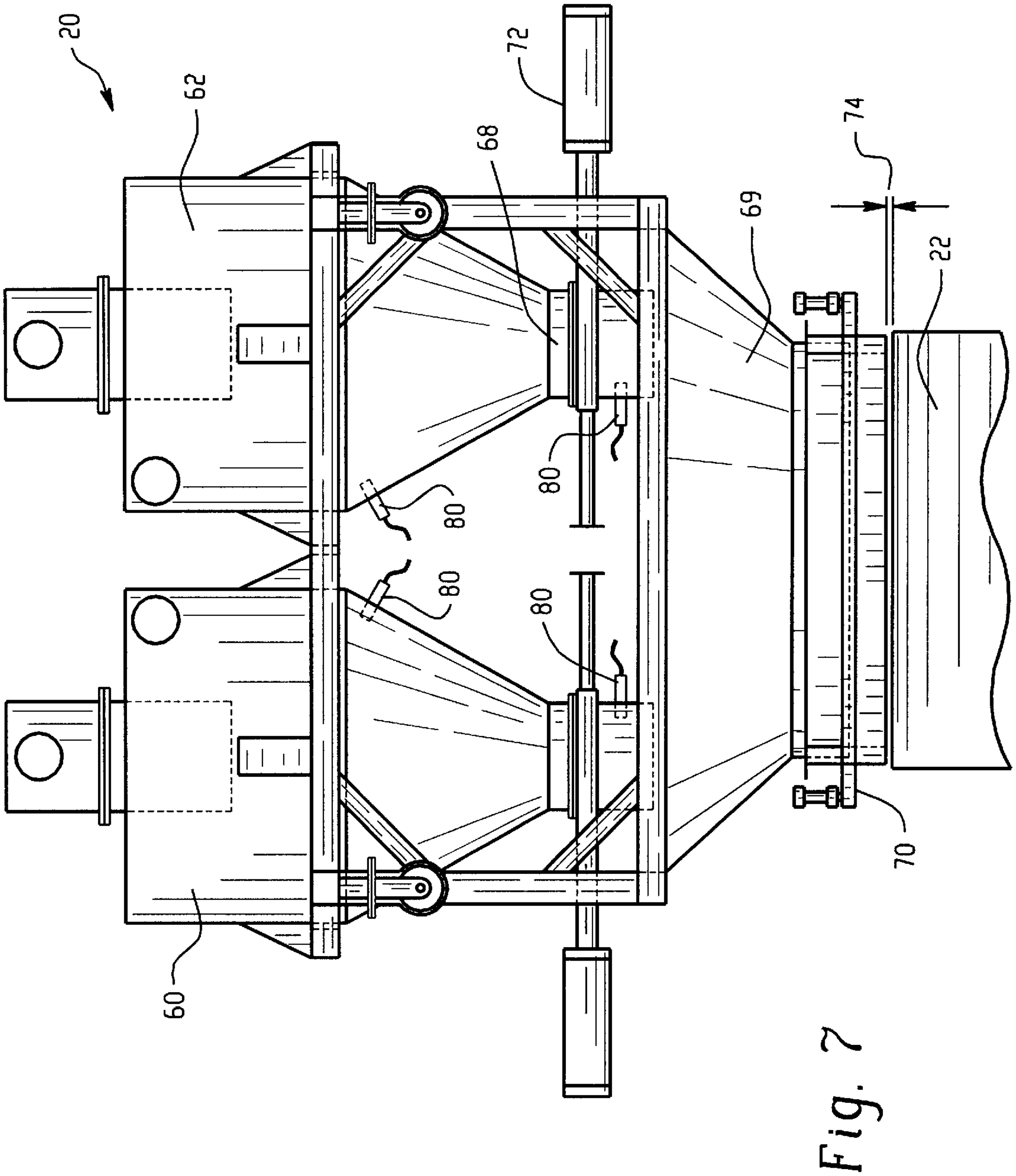
FIG. 7 is a side elevational view of the belt feeding system of the system of FIG. 1.
Figure 8A:
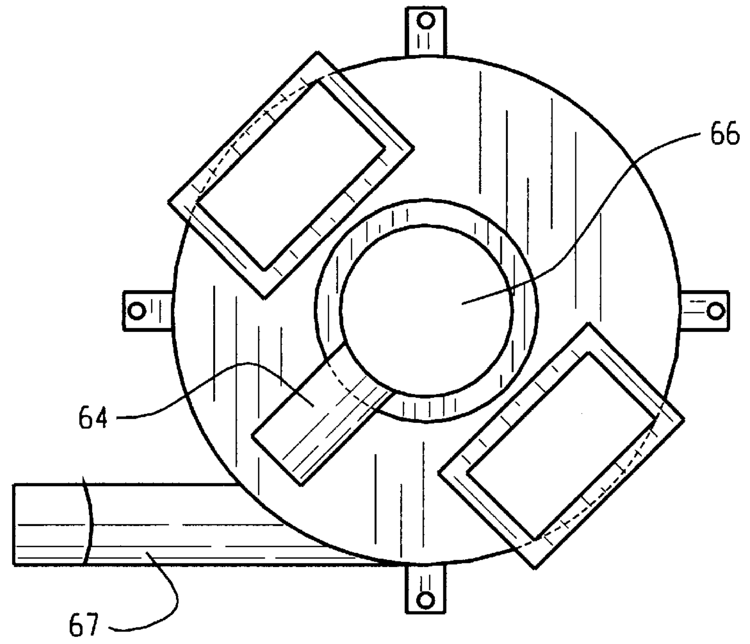
FIGS. 8A and 8B are top and side elevational views of the cyclone hopper of the system of FIG. 7.
Figure 8B:
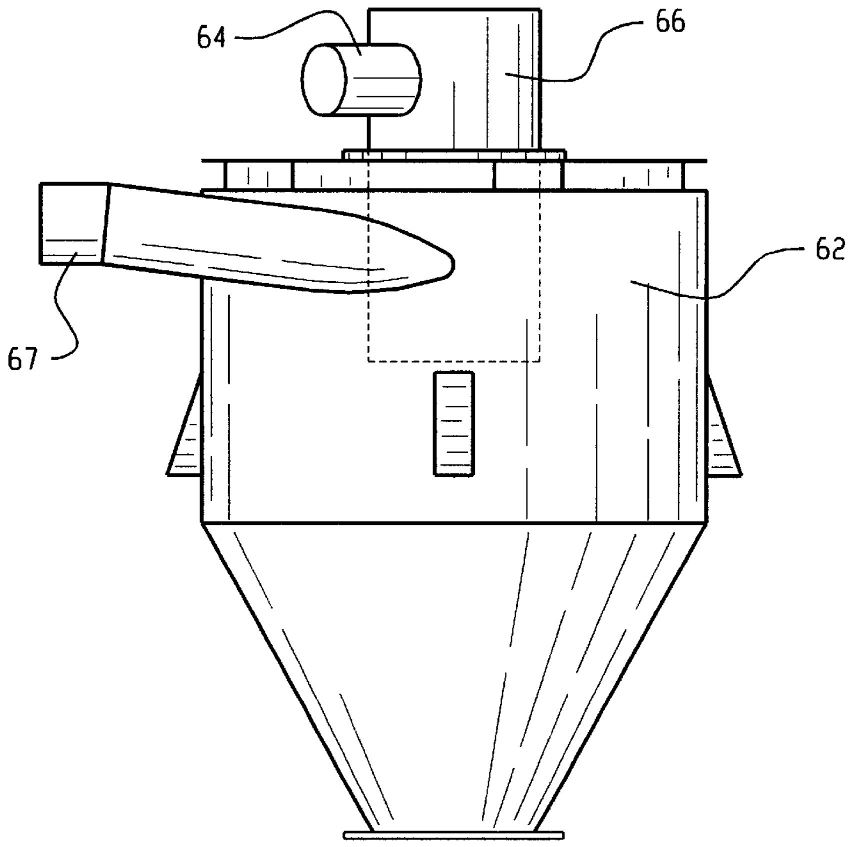

Referring now to FIG. 7, the belt feed system 20 includes two cyclone hoppers 60, 62 which are shown in more detail in FIG. 8. At the top of the hoppers 60, 62 is a tangential inlet 67 which carries the air and pellets into the hoppers. Centrifugal force urges the heavier pellets radially outward. As the velocity of the pellets is reduced, they fall to the bottom of the hopper. Excess air is discharged through an air outlet 64 at the top center 66 of the hoppers 60, 62.

Figure 9C:
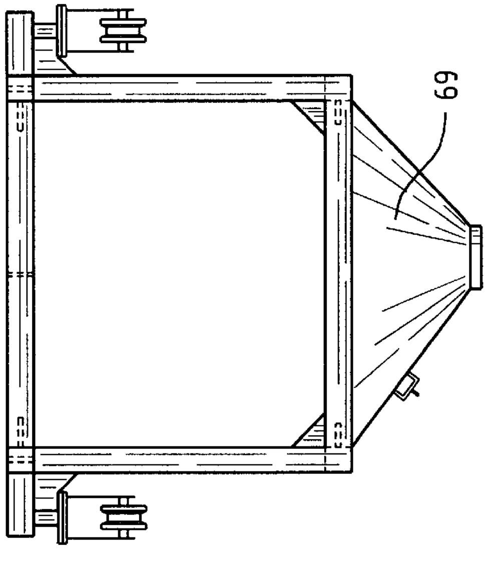
FIGS. 9A, 9B and 9C are top and two side elevational views of the surge hopper of the system of FIG. 7.
Figure 9A:
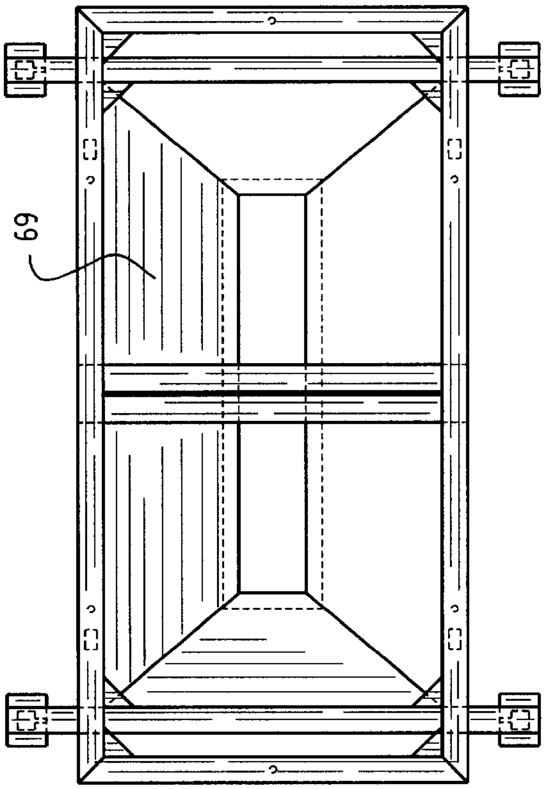
Figure 9B:
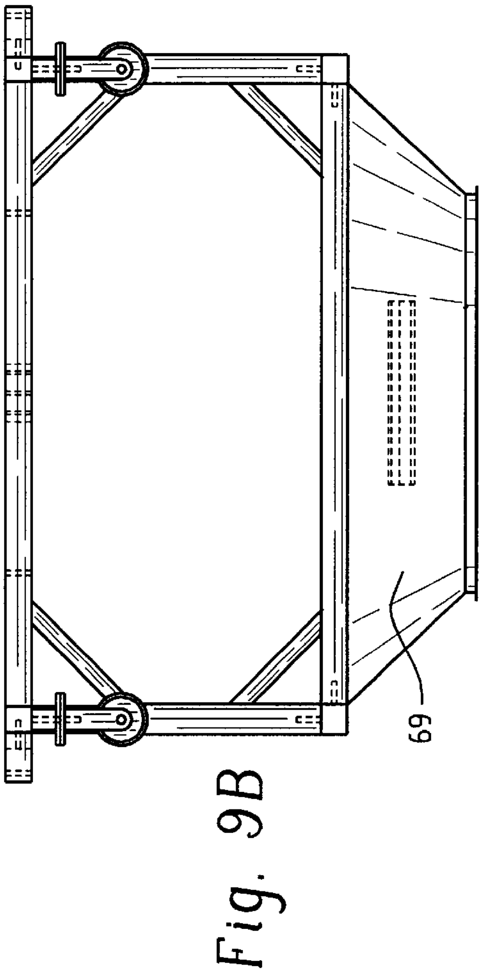

As shown in FIG. 7, slide gate assemblies 68 are located at the bottom of the hoppers 60, 62 and above a surge hopper 69. The two cyclone hoppers 60, 62 feed into and are mounted above the surge hopper 69, which is shown in more detail in FIGS. 9A, 9B and 9C.

Figure 10C:
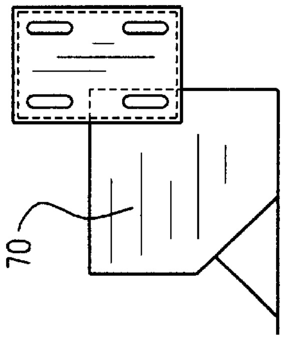
FIGS. 10A, 10B and 10C are top and two side elevational views of the metering gate of the system of FIG. 7.
Figure 10A:
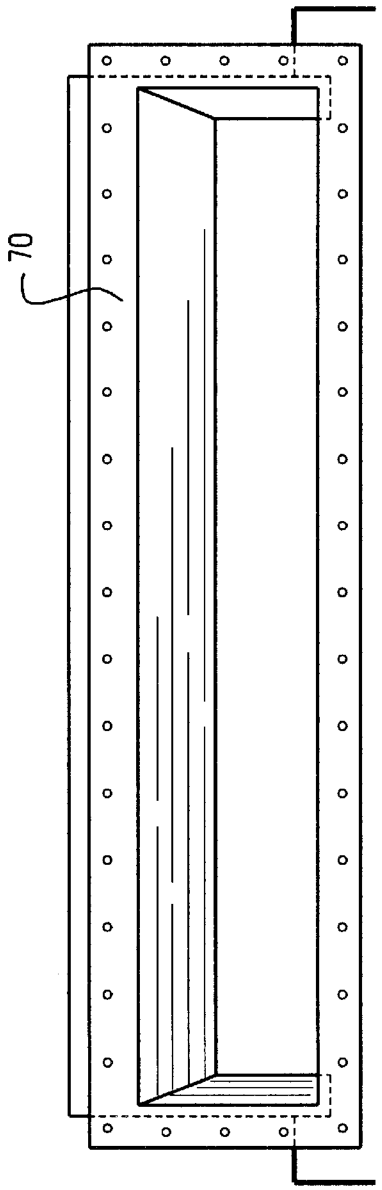
Figure 10B:
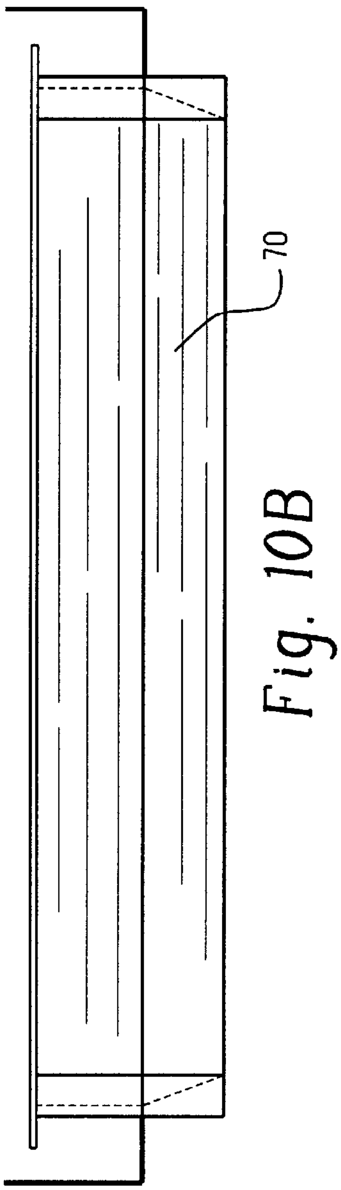

At the bottom of the surge hopper 69 is a metering gate 70, shown in more detail in FIG. 10. The surge hopper 69 feeds onto the belt conveyor 22, as shown in FIG. 7. The metering gate is set to a fixed, but adjustable, level above the belt 22 to control the thickness of the layer of pellets deposited on the belt conveyor.

Sensors 80 placed adjacent a top surface and bottom surface of the hoppers 60, 62 are used to monitor the level of pellets within the hoppers. The slide gates 68 are responsive to the sensors 80 and open and close through the use of a metering valve 72 as additional pellets are required to maintain the pellet pressure head in the hopper 69 if the pellets run dry.

The pellets feed into the surge hopper 69 and onto the conveyor belt 22. The metering gate 70 opens when the level of pellets is high and closes when the level is too low. A small gap 74 can exist between the gate 70 and the conveyor belt 22 to allow movement of the pellets onto the conveyor and to prevent excess pellets from being deposited onto the conveyor belt 22.

After the pellets are deposited loose onto the conveyor belt 22, they travel passed and are irradiated or cured by a radiation beam from vertically above the conveyor belt 22. The beam is monitored to control the rate at which the pellets are irradiated. An interlock is provided between the belt conveyor and beam to ensure coordination between the operation of the two systems.

Figure 11B:
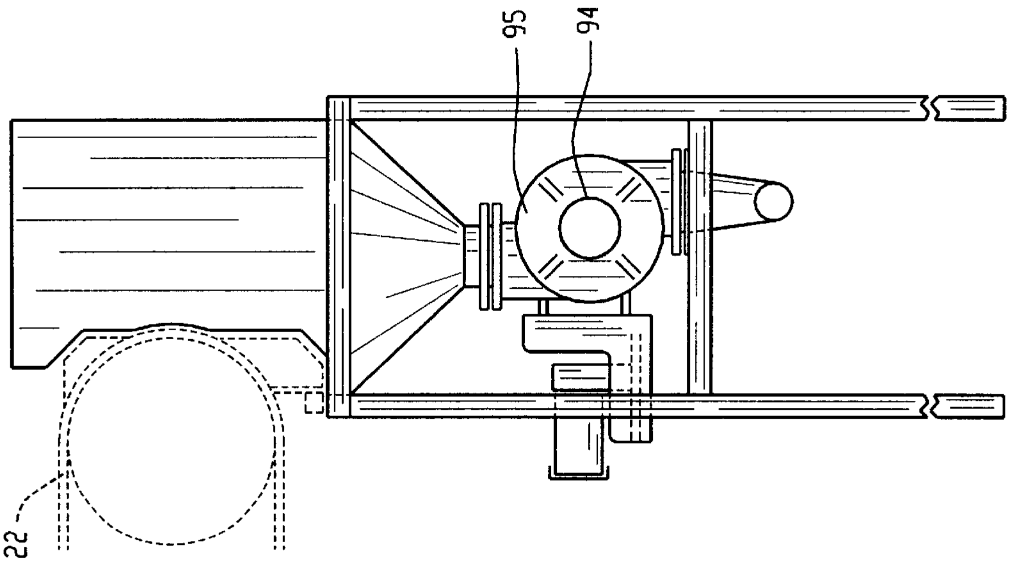
FIGS. 11A and 11B are two side elevational views of the receiving hopper of the system of FIG. 1.
Figure 11A:
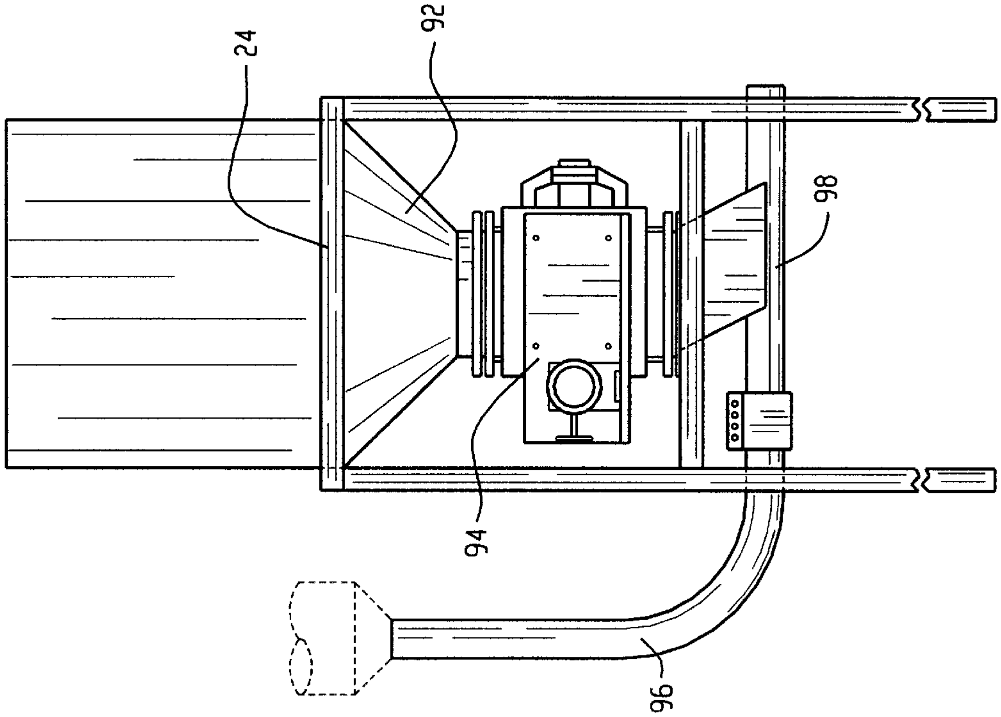

After the pellets are irradiated or cured, they are received by the receiving hopper 24 located below the belt conveyor, which is shown in detail in FIGS. 11A and 11B. The pellets fall from the end of the conveyor belt 22 (shown in phantom in FIG. 11B) into a hopper 92. A metering device or valve 94, which is located below the hopper 92, has a plurality of vanes 95 that define chambers or pockets to control the amount of pellets flowing through the hopper. The vanes prevent air from blowing back up into the hopper. The valve 94 also reduces noise associated with the air and pellet flow. A fresh air inlet 96 provides air flow to the pipe 98 to entrain the pellets.

Referring again to FIG. 1, the cured pellets are fed from pipe 98 into a pipe inlet 26 and then into pipes or tubes 28 to the fourth manifold 30 to the filling or receiving station 32. The filling station 32 also has two cyclone hoppers 100, 102 which are arranged and used in a similar manner to the hoppers 60, 62 of the belt feeding system 20, as described above.

Preferably, a vibratory screener (not shown) is positioned below the cyclone hoppers 100, 102 of the receiving station. This screen aids in controlling the rate and amount of pellets being fed into the surge hopper. The pellets initially contact the screen and then as the screen vibrates, the pellets slip through openings in the screen. The vibrating screen keeps any pellets which fused together from entering the packaging boxes. The pellets are deposited into the same box or bag that was used initially to bring them into the system. The boxes or bags are placed onto a conveyor system and are moved out of the way from other boxes or bags. The pellets are boxed or bagged and are then ready for use.

When the pellets are entrained in the moving air, the entrained pellets are treated as a fluid. Consequently, other fluids, such as liquid sewage, waste water of other types, stack gases, and the like can be treated with an analogous system.

An alternative embodiment of the present invention includes a thermal sensor downstream of the electron beam to monitor the temperature of the pellets. If the pellets were coming out of the electron beam too warm, the system could be shut down to determine where a malfunction is occurring or the beam energy, thickness of the pellet layer, and belt conveyor speed is adjusted.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalent thereof.

Having thus described the preferred embodiment, the invention is now claimed to be:

1. A particulate irradiating system comprising:

a radiation source;

a conveying system adjacent said radiation source for transporting loose particulate material past the radiation source; and a pneumatic delivery system adjacent said conveying system for fluidly conveying said particulate material to said conveying system, the delivery system including a first inlet manifold having a plurality of pneumatic tubes in a spaced relation through which the particulate material is conveyed; and, a first discharge manifold connected with the plurality of pneumatic tubes for separating said particulate material from fluid and delivering the particulate material to the conveying system.

2. The particulate irradiating system of claim 1, further comprising a dump hopper which dumps said particulate material into said delivery system.

3. The particulate irradiating system of claim 1, wherein the discharge manifold includes:

a feed hopper positioned above said conveying system for discharging said particulate material onto said conveying system.

4. The particulate irradiating system of claim 3, wherein said feed hopper further comprises a metering gate at a base of said feed hopper, said metering gate controls a layer of particulate material deposited onto said conveying system.

5. The particulate irradiating system of claim 3, wherein the discharge manifold includes:

a first and second cyclone hopper positioned adjacent each other and above said feed hopper.

6. The particulate irradiating system of claim 5, wherein said cyclone hoppers further comprise sensors located adjacent a top portion and bottom portion of said hoppers, said sensors being used to monitor a level of particulate material within said hoppers.

7. The particulate irradiating system of claim 6, wherein said pneumatic delivery system further comprises:

a metering valve to open and close the hopper in response to the sensors.

8. The particulate irradiating system of claim 1, further comprising a receiving hopper for receiving said particulate material from said conveying system, said receiving hopper being located below said conveying system.

9. The particulate irradiating system of claim 8, wherein said receiving hopper comprises a hopper and a metering device positioned below said hopper.

10. The particulate irradiating system of claim 9, wherein said metering device comprises:

a plurality of veins to control the amount of particulate material flowing through the hopper and reduce noise from air flow.

11. The particulate irradiating system of claim 1 wherein said radiation source provides an electron beam to irradiate said particulate material.

12. The particulate irradiating system of claim 1, wherein said particulate material comprises polymer pellets.

13. A particulate irradiating system comprising:

a radiation source which generates a beam of radiation;

a conveyor for transporting loose particulate material through the beam of radiation;

a pneumatic delivery system for fluidly transporting said particulate material entrained in fluid;

a separator connected with the pneumatic delivery system to separate the particulate material from the fluid and deposit the particulate material on the conveyor upstream of the radiation beam;

a receiver which receives the particulate material from said conveyor downstream from the radiation beam; and, an inlet manifold adjacent said receiver and at least one pneumatic tube extending from said inlet manifold for entraining said particulate material in fluid.

14. The particulate irradiating system of claim 13, further comprising a discharge manifold extending from said at least one pneumatic tube for separating said particulate material from the fluid.

15. The particulate irradiating system of claim 14 further comprising a receiving station which receives said particulate material from said discharge manifold.

16. The particulate irradiating system of claim 15, wherein said receiving station further comprises a pair of cyclone hoppers which deposit said particulate material into packaging.

17. A particulate irradiating system comprising:

a particle accelerator for generating a beam of accelerated electrons;

a belt conveyor for transporting loose particulate material through the accelerated electron beam;

a pneumatic conveying system for providing air through which the particulate material is fluidly conveyed;

a feed device which receives the particulate material and air from the pneumatic conveying system and deposits a layer of the particulate material on a conveyor belt of the belt conveyor, the feed device including:

a level control which controls a thickness of the particulate material layer on the conveyor belt; and a receiving device for receiving said particulate material from said conveyor belt, said receiving system being located below said conveyor belt.

18. The particulate irradiating system of claim 17, wherein said pneumatic system further comprises a first discharge manifold extending from said at least one tube for separating said particulate material from air.

19. The particulate irradiating system of claim 18, further comprising a second inlet manifold adjacent said receiving device and at least one tube for entraining said particulate material received in the receiving device in an air flow.

20. The particulate irradiating system of claim 19, further comprising a second discharge manifold extending from said at least one tube for separating said particulate material from air.

21. The particulate irradiating system of claim 20 further comprising a receiving station which receives said particulate material from said second discharge manifold.

22. A method of irradiating particulates comprising:

accelerating electrons;

forming the accelerated electrons into an electron beam;

entraining a particulate material in air and pneumatically conveying the particulate material adjacent the electron beam;

depositing the particulate material on a moving belt;

conveying the particulate material through the electron beam on the moving belt; and pneumatically re-entraining said particulate material in air from the moving belt.

23. The method as set forth in claim 22 further including:

controlling a thickness in a direction of the electron beam of a layer of the particulate material on the moving belt.

24. The method as set forth in claim 22 further including:

pneumatically conveying the material to a location remote from the electron beam; and at the remote location depositing the particulate material in packaging.

25. A particulate irradiating system comprising:

a means for generating a beam of radiation;

a conveyor belt which passes through the beam of radiation;

a means for conveying particulates entrained in air onto said conveyor belt;

a means for de-entraining the particulates from the air and depositing a layer of the particulates on the conveyor belt upstream of the radiation beam;

a means for controlling a thickness of the deposited particulate layer; and, a means for receiving said particulates from said conveyor belt downstream of the radiation beam and, entraining the particulates in a fluid flow.

26. A method of irradiating particulates comprising:

pneumatically conveying particulate material entrained in fluid through pneumatic tubes;

de-entraining and depositing the particulate material onto a conveyor belt;

conveying the deposited particulate material on the conveyor belt through an electron beam; and, re-entraining and pneumatically conveying the particulate material from the conveyor belt through pneumatic tubes.

* * * * *